(12) United States Patent
Lee et al.

(10) Patent No.: US 11,658,162 B2
(45) Date of Patent: May 23, 2023

(54) MICRO-LED DISPLAY AND MANUFACTURING METHOD THEREFOR

(71) Applicant: SAMSUNG ELECTRONICS CO., LTD., Suwon-si (KR)

(72) Inventors: Youngchul Lee, Hwaseong-si (KR); Taesang Park, Seoul (KR); Kyoree Lee, Suwon-si (KR); Tackmo Lee, Suwon-si (KR); Gyun Heo, Suwon-si (KR); Youngjun Moon, Hwaseong-si (KR); Won Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 416 days.

(21) Appl. No.: 16/629,768

(22) PCT Filed: Jun. 26, 2018

(86) PCT No.: PCT/KR2018/007191
§ 371 (c)(1),
(2) Date: Jan. 9, 2020

(87) PCT Pub. No.: WO2019/013469
PCT Pub. Date: Jan. 17, 2019

(65) Prior Publication Data
US 2021/0375833 A1 Dec. 2, 2021

(30) Foreign Application Priority Data

Jul. 10, 2017 (KR) .................. 10-2017-0087003
Sep. 26, 2017 (KR) .................. 10-2017-0124233
May 28, 2018 (KR) .................. 10-2018-0060319

(51) Int. Cl.
*H01L 25/075* (2006.01)
*H01L 25/16* (2006.01)
(Continued)

(52) U.S. Cl.
CPC ........ *H01L 25/0753* (2013.01); *H01L 25/167* (2013.01); *H01L 33/0095* (2013.01);
(Continued)

(58) Field of Classification Search
CPC ....... H01L 33/486; H01L 33/62; H01L 33/52; H01L 33/58; H01L 33/60; H01L 33/54;
(Continued)

(56) References Cited

U.S. PATENT DOCUMENTS

2008/0017873 A1   1/2008  Tomoda et al.
2010/0244059 A1*  9/2010  Iida .................. H01L 24/19
                                              257/E33.044

(Continued)

FOREIGN PATENT DOCUMENTS

CN    103943764    7/2014
CN    105493297    4/2016
(Continued)

OTHER PUBLICATIONS

International Search Report for PCT/KR2018/007191 dated Oct. 12, 2018, 4 pages.
(Continued)

*Primary Examiner* — Raj R Gupta
(74) *Attorney, Agent, or Firm* — Nixon & Vanderhye P.C.

(57) ABSTRACT

The disclosure describes a micro Light Emitting Diode (LED) display. The display may include a Printed Circuit Board (PCB) including a plurality of solder pads, a micro LED package including a plurality of micro LED chips, and a plurality of solder electrodes which bond the micro LED chips onto the solder pads of the PCB. The micro LED package may be re-arranged in an Red Green Blue (RGB) state on a temporary fixing film by using a pickup device in accordance with a display pixel configuration, after the micro LED chips are attached to a carrier film.

6 Claims, 28 Drawing Sheets

(51) Int. Cl.
  *H01L 33/00* (2010.01)
  *H01L 33/62* (2010.01)
  *H01L 33/52* (2010.01)
(52) U.S. Cl.
  CPC .......... *H01L 33/62* (2013.01); *H01L 33/0093* (2020.05); *H01L 33/52* (2013.01); *H01L 2933/005* (2013.01); *H01L 2933/0066* (2013.01)
(58) Field of Classification Search
  CPC ..... H01L 33/56; H01L 27/153; H01L 27/156; H01L 25/0753; H01L 25/075; H01L 25/167
  See application file for complete search history.

(56) References Cited

U.S. PATENT DOCUMENTS

| | | | | |
|---|---|---|---|---|
| 2010/0259164 | A1* | 10/2010 | Oohata | H01L 24/83 313/505 |
| 2012/0223875 | A1 | 9/2012 | Lau et al. | |
| 2015/0371585 | A1 | 12/2015 | Bower et al. | |
| 2016/0155892 | A1 | 6/2016 | Li et al. | |
| 2017/0179097 | A1* | 6/2017 | Zhang | H01L 27/124 |
| 2017/0256730 | A1 | 9/2017 | Kim et al. | |
| 2018/0053742 | A1* | 2/2018 | Ting | H01L 24/83 |
| 2018/0333945 | A1* | 11/2018 | Li | B32B 37/12 |

FOREIGN PATENT DOCUMENTS

| | | |
|---|---|---|
| CN | 106783648 | 5/2017 |
| JP | 2011-096929 | 5/2011 |
| KR | 10-2007-0100486 | 10/2007 |
| KR | 10-2016-0064850 | 6/2016 |
| KR | 10-2017-0020485 | 2/2017 |
| WO | 2016/183844 | 11/2016 |

OTHER PUBLICATIONS

Written Opinion of the ISA for PCT/KR2018/007191 dated Oct. 12, 2018, 7 pages.

Notice of Preliminary Rejection dated Oct. 17, 2022 in Korean Patent Application No. 10-2018-0060319 and English-language translation.

Notice of Patent Grant dated Jan. 16, 2023 in Korean Application No. 10-10-2018-0060319 and English-language machine translation.

Office Action dated Mar. 23, 2023 in Chinese Patent Application No. CN201880045837.4 and English-language translation.

* cited by examiner

MICRO-LED DISPLAY AND
MANUFACTURING METHOD THEREFOR

This application is the U.S. national phase of International Application No. PCT/KR2018/007191 filed Jun. 26, 2018 which designated the U.S. and claims priority to KR Patent Application No. 10-2017-0087003 filed Jul. 10, 2017, KR Patent Application No. 10-2017-0124233 filed Sep. 26, 2017 and KR Patent Application No. 10-2018-0060319 filed May 28, 2018, the entire contents of each of which are hereby incorporated by reference.

TECHNICAL FIELD

Various embodiments of the disclosure relate to a micro light emitting diode (LED) display and a manufacturing method thereof.

BACKGROUND ART

Although an Organic Light Emitting Diode (OLED) panel is drawing attention as a new display for replacing a Liquid Crystal Display (LCD) panel, a high price issue caused by a low production yield, large size and reliability issues, or the like still remains as problems to be solved. Researches on a technique for producing a display panel by directly mounting an LED which emits Red (R), Green (G), and Blue (B) on a substrate have been attempted as a new product to compensate for this problems.

However, in order to implement the display, a micro LED (µLED) corresponding to a current pixel needs to be developed first, and there are issues to be solved, such as how to pick up micro LEDs of dozens of micrometers (µm) and how precisely the micro LEDs will be placed on a Printed Circuit Board (PCB), and how to arrange input/output terminals to be electrically coupled with a main PCB.

In case of a display which uses an LED package, since the LED package having a size of several millimeters (mm) is basically used, it is inappropriate to be applied to a near-field display. A size of one pixel of a home display is usually about 100 µm, and a size of an R/G/B sub-pixel constituting this is only dozens of µm.

SUMMARY

Although it has recently been shown that an LED chip having a size of dozens of µm can be mass-produced, it is impossible to pick up a micro LED (µLED) chip to put it down on a PCB when using a current pickup technique. In addition thereto, the smaller the size of the chip, the smaller the area of the connecting pad. Therefore, there is a need for a technique of mounting the micro LED chip on an area of several µm of the PCB, which is difficult to be implemented as a display when using the current technique.

For example, about 25 million micro LEDs are required to produce a 4K UHD display panel. Thus, even if it is managed with a yield of 99.99% (100 ppm), 2500 reworks are required, and it is currently impossible to implement a technique for removing a micro LED chip mounted with an interval of dozens of µm and individually mounting it again.

Conventionally, although a solder ball is directly attached on a pad of a wafer, there is a concern that a short may occur between neighboring solder balls due to a dense pad intervals caused by an increase in a degree of integration.

In addition, since micro LED chips are stacked, for example, there is a need to extend a pad formed at a center portion of a chip to an edge portion. Therefore, there is a need for redistribution of a location where a terminal for connection with the outside, i.e., a solder ball, by using metal interconnects.

Various embodiments of the disclosure are to manufacture a micro LED array package through a Panel Level Package (PLP) redistribution process, and to manufacture a PCB through a Thin Film Transistor (TFT) process, thereby providing a micro LED display having a structure for coupling the micro LED array package and the PCB through a thermal compression process.

Various embodiments of the disclosure are to verify capability of a micro LED array package to remove an error if the error occurs in in the micro LED array package, or to perform reproduction or reoperation so as to be connectable with another micro LED chip and a PCB, thereby providing a micro LED display with an improved yield.

Various embodiments of the disclosure are to manufacture a micro LED array package through a PLP redistribution process and to manufacture a PCB through a TFT process so that the micro LED array package is laminated on the PCB, thereby providing a micro LED display having an input/output terminal with an increased degree of integration.

A micro Light Emitting Diode (LED) display according to various embodiments of the disclosure may include a Printed Circuit Board (PCB) including a plurality of solder pads, a micro LED package including a plurality of micro LED chips, and a plurality of solder electrodes which bond the micro LED chips onto the solder pads of the PCB. The micro LED package may be re-arranged in a Red Green Blue (RGB) state on a temporary fixing film by using a pickup device in accordance with a display pixel configuration, after the micro LED chips are attached to a carrier film.

A method of manufacturing a micro LED display according to various embodiments of the disclosure may include a first step of attaching each of micro LED chips to a carrier film in a pad down form, a second step of re-arranging the attached micro LED to a temporary fixing film by using a pickup device in accordance with a pixel configuration element of the display, a third step of molding the re-arranged micro LED, and a fourth step of performing Fan-Out Panel Level Package (FOPLP) process on the molded micro LED. A micro LED display according to various embodiments of the disclosure may include a micro LED array package, a main PCB having a Thin Film Transistor (TFT) structure and laminated to the micro LED array package, and a member formed between the micro LED array package and the PCB and supporting a connection state between the micro LED array package and the PCB.

Various embodiments of the disclosure are to manufacture a micro LED array package through a PLP redistribution process and to manufacture a PCB through a TFT process so that the micro LED array packet is laminated on the PDB. Therefore, a micro LED display having an input/output terminal with an increased degree of integration can be provided, thereby manufacturing a micro LED display panel, and improving a yield.

Various embodiments of the disclosure are to verify capability of a micro LED array package to remove an error if the error occurs in in the micro LED array package, or to perform reproduction or reoperation so as to be connectable with another micro LED chip and a PCB, thereby improving a mass-production yield.

Various embodiments of the disclosure are to produce a not easily handled compact micro LED as a part so that it is easily mounted on a substrate with a high yield by utilizing a commercially available mounter or the like.

Various embodiments of the disclosure are to easily perform a rework of a compact component, which has not been secured, by using a pre-secured technique, when reworking a wrongly mounted part.

DETAILED DESCRIPTION OF EXAMPLE EMBODIMENTS

Figure 1A:
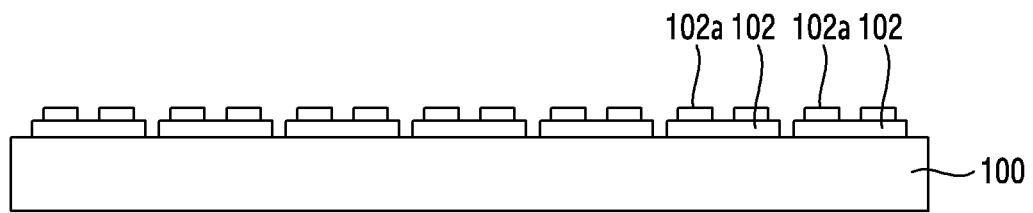
FIGS. 1A, 1B, 1C, 1D, 1E, 1F, 1G, 1H, 1I, and 1J are a cross-sectional views illustrating a method of manufacturing a micro LED display according to various embodiments of the disclosure, respectively.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

An expression "have", "may have", "include" or "may include" or the like used in the disclosure is intended to indicate a presence of a corresponding characteristic (e.g., a number, a function, an operation, or a component such as a component), and should be understood that there are additional possibilities of one or more other characteristics.

In the disclosure, an expression "A or B", "A and/or B", or "one or more of A and/or B" or the like may include all possible combinations of items enumerated together. For example, "A or B", "at least one of A and B", or "at least one of A or B" may indicate all cases where: (1) at least one A is included; (2) at least one B is included; and (3) at least one A and at least one B are both included.

Although expressions such as "$1^{st}$", "$2^{nd}$", "first", and "second" may be used in various embodiments to express various components, it is not intended to limit the corresponding components. The above expressions may be used to distinguish one component from another component. For example, a Pt user device and a $2^{nd}$ user device are both user devices, and indicate different user devices. For example, a Pt component may be termed a $2^{nd}$ component, and similarly, the $2^{nd}$ component may be termed the $1^{st}$ component without departing from the scope of the disclosure.

When a certain component (e.g., the $1^{st}$ component) is mentioned as being "operatively or communicatively coupled with/to" or "connected to" a different component (e.g., the $2^{nd}$ component), it is to be understood that the certain component is directly coupled with/to another component or can be coupled with/to the different component via another component (e.g., a $3^{rd}$ component). On the other hand, when the certain component (e.g., the $1^{st}$ component) is mentioned as being "directly coupled with/to" or "directly connected to" the different component (e.g., the $2^{nd}$ component), it may be understood that another component (e.g., the $3^{rd}$ component) is not present between the certain component and the different component.

An expression "configured to" used in the disclosure may be interchangeably used with, for example, "suitable for", "having the capacity to", "designed to", "adapted to", "made to", or "capable of" according to a situation. A term "configured to" may not imply only "specially designed to" in a hardware manner. Instead, in a certain situation, an expressed "a device configured to" may imply that the device is "capable of" together with other devices or components. For example, "a processor configured to perform A, B, and C" may imply a dedicated processor (e.g., an embedded processor) for performing a corresponding operation or a generic-purpose processor (e.g., Central Processing Unit (CPU) or an application processor) capable of performing corresponding operations by executing one or more software programs stored in a memory device.

Terms used in the disclosure are for the purpose of describing particular embodiments only and are not intended to limit other embodiments. A singular expression may include a plural expression unless there is a contextually distinctive difference. Unless otherwise defined, all terms (including technical and scientific terms) used herein have the same meaning as commonly understood by those ordinarily skilled in the art disclosed in the disclosure. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Optionally, the terms defined in the disclosure should not be interpreted to exclude the embodiments of the disclosure.

An electronic device according to various embodiments of the disclosure may include at least one of, for example, a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device (e.g., smart glasses, a Head-Mounted Display (HMD), electronic clothes, an electronic bracelet, an electronic necklace, an electronic appcessory, an electronic tattoo, a smart mirror, or a smart watch).

According to some embodiments, the electronic device may be a home appliance. The home appliance may include, for example, at least one of a TeleVision (TV), a Digital Video Disk (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™, PlayStation™), an electronic dictionary, an electronic key, a camcorder, and an electronic picture frame.

According to other embodiments, the electronic device may include at least one of various medical devices (e.g., various portable medical measuring devices (e.g., a blood sugar measuring device, a heartrate measuring device, a blood pressure measuring device, a body temperature measuring device, etc.), Magnetic Resonance Angiography (MRA), Magnetic Resonance Imaging (MRI), Computed Tomography (CT), imaging equipment, ultrasonic instrument, etc.)), a navigation device, a Global Navigation Satellite System (GNSS), an Event Data Recorder (EDR), a Flight Data Recorder (FDR), a car infotainment device, an electronic equipment for ship (e.g., a vessel navigation device, a gyro compass, etc.), avionics, a security device, a car head unit, an industrial or domestic robot, an Automatic Teller's Machine (ATM) of financial institutions, Point Of Sales (POS) of shops, and Internet of things (e.g., a light bulb, various sensors, an electric or gas meter, a sprinkler device, a fire alarm, a thermostat, a streetlamp, a toaster, a fitness equipment, a hot water tank, a heater, a boiler, etc.).

According to some embodiments, the electronic device may include at least one of furniture or a part of buildings/constructions, an electronic board, an electronic signature input device, a projector, and various measurement machines (e.g., water supply, electricity, gas, propagation measurement machine, etc.). In various embodiments, the electronic device may be one or more combinations of the aforementioned various devices. According to some embodiments, the electronic device may be a flexible device. Further, the electronic device according to an embodiment of the disclosure is not limited to the aforementioned devices, and may include a new electronic device depending on technical progress.

Hereinafter, a structure of a display and a manufacturing method will be described by using a micro LED mounting technique according to various embodiments of the disclosure with reference to the accompanying drawings.

Since the structure of the display according to the disclosure can be implemented irrespective of a size of an LED, there is no restriction on a size of the LED in use. For example, a display for illumination may use an LED with a level of several millimeters (mm), a large display such as an indoor/outdoor signage may use an LED with a level of hundreds of micrometers (μm), and a display for a display usage may use an LED with a level of dozens of μm.

FIG. 1A to FIG. 1I are cross-sectional views sequentially illustrating a method of manufacturing a micro LED display according to various embodiments of the disclosure.

Since the structure of the display according to the disclosure can be implemented irrespective of a size of an LED, there is no restriction on a size of the LED in use. For example, a display for illumination may use an LED with a level of several mm, a large display such as an indoor/outdoor signage may use an LED with a level of hundreds of μm, and a display for a display usage may use an LED with a level of dozens of μm.

A size of the micro LED chip mentioned in the disclosure may refer to a micro LED chip having a size less than 100 μm, for example, a size of 1 to 99 μm.

Referring to FIG. 1A, a micro LED 102 may be manufactured by growing in a single crystal state of a compound semiconductor on a sapphire (or SiX) substrate 100 at a high temperature/high pressure, and may be configured differently according to each composition.

For example, Red, Green, and Blue may be composed of compound semiconductors of GaAs, InCaP, and GaN, respectively. Different color may be implemented since a wavelength is determined according to a unique energy band gap of each composition.

In order for a grown micro LED wafer to emit light, dozens of steps of semiconductor processing capable of providing holes and electrons shall be performed with an electrically connectable structure. In this case, a pad 102a of the micro LED 102 may be manufactured in a vertically upward direction (a pad-up type) of the sapphire substrate 100.

Figure 1B:
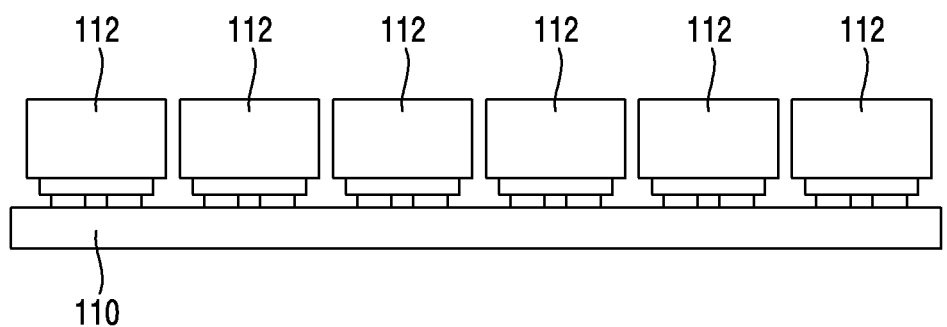

Referring to FIG. 1B, a manufactured micro LED 112 may be separated into a plurality of parts by singulation and flipping processes. Each separated micro LED may be the micro LED chip 112. Each of the micro LED chips 112 may be attached in a state of being aligned on a carrier film or a transfer film.

In addition, a method of attaching the manufactured micro LED 112 to the carrier film 110 may be at least any one of a method of using an uncured resin (liquid Polyimide (PI), Polydimethylsiloxane (PDMS), Polyethylene terephthalate (PET), epoxy, etc.) and a method of using an adhesiveness difference of a film-type tape such as an ultraviolet curing tape (UV tape) and a non-UV tape or a thermal foam tape or the like.

Figure 1C:
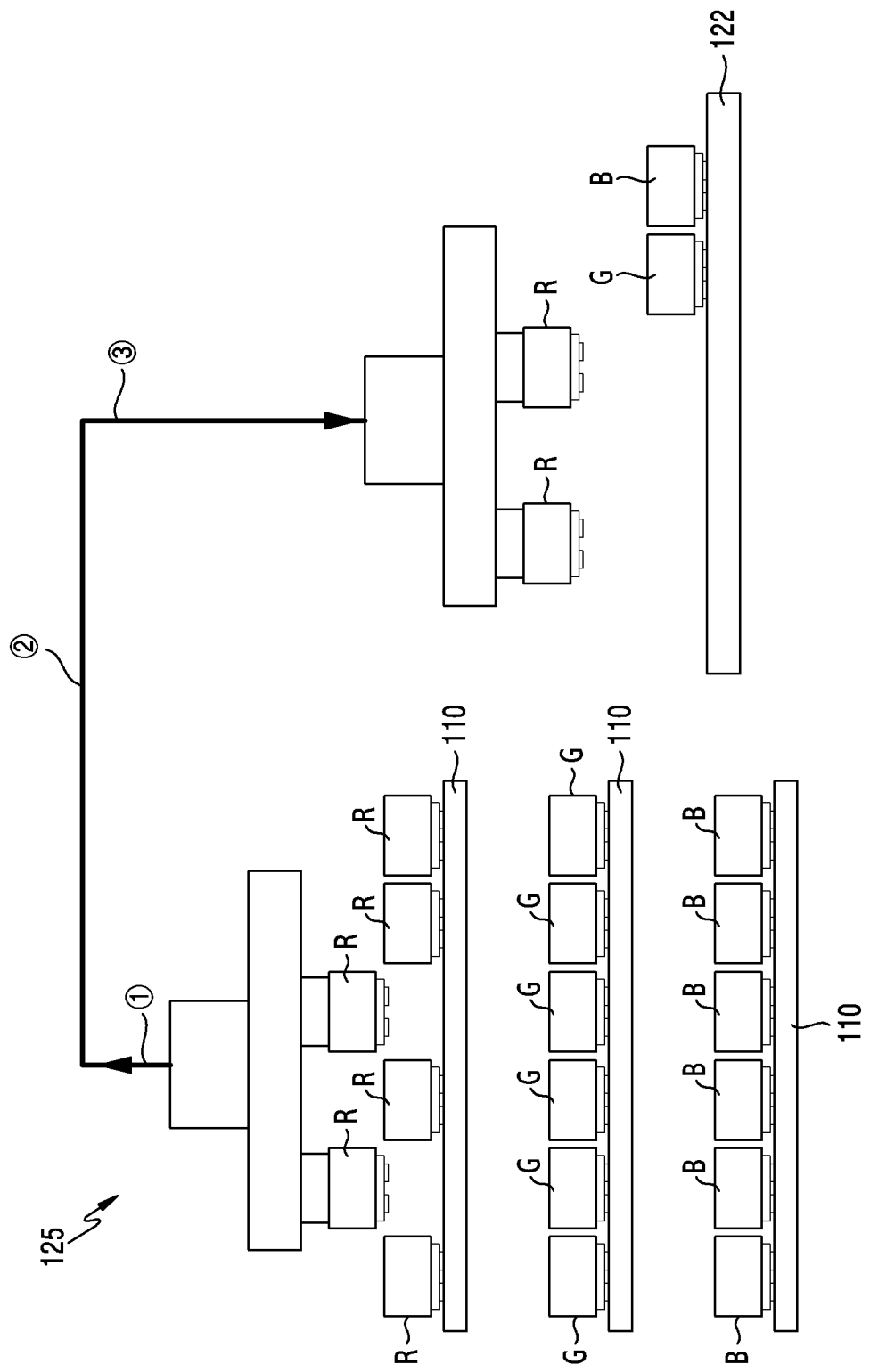

Referring to FIG. 1C, a plurality of micro LED chips R/G/B attached to be aligned may be re-arranged on a temporary fixing film 122 in accordance with elements (e.g., pitch, color (R/GB), gap, etc.) constituting a display pixel.

Hereinafter, the micro LED chip will be denoted by R/G/B. R denotes a micro LED chip which emits red, G denotes a micro LED chip which emits green, and B denotes a micro LED chip which emits blue.

For example, a method of re-arranging a plurality of micro LED chips R/G/B may pick up the micro LED chip to fix each of the micro LED chips R/G/B on the temporary fixing film 122 by using a pickup device 125 (a pickup tool or a picker).

In addition, a method of re-arranging each of a plurality of micro LED chips R/G/B may be any one of a method of picking up the micro LED chips R/G/B to move them on the temporary fixing film, a method of picking up the micro LED chips R/G/B to fix them on the temporary fixing film by using static electricity, a method of picking up the micro LED chips R/G/B to fix them on the temporary fixing film by using a magnetic field, a method of picking up the micro LED chips R/G/B to fix them on the temporary fixing film by using vacuum force, and a method of picking up the micro LED chips R/G/B to fix them on the temporary fixing film by using an adhesiveness difference of a tape.

After aligned micro LEDs B emitting blue, aligned micro LEDs G emitting green, and micro LEDs R emitting red are prepared, the micro LEDs R/G/B selected by the pickup device 125 may be moved to be re-aligned on the temporary fixing film 122. Arrow directions ①, ②, and ③ indicate movement directions of the pickup device 125. Regarding the movement direction of the pickup device 125, the selected micro LED chips R/G/B are raised in a vertically upward direction ①. Thereafter, the selected micro LED chips R/G/B move in a horizontal direction ② and move in a vertically downward direction ③. Finally, the moved micro LED chips R/G/B may be re-arranged by being put down on the temporary fixing film 122. The moved micro LED chips R/G/B may be fixed in a state where RGB are re-arranged as one set. The temporary fixing film 122 may be carried by being attached on a carrier film. Thereafter, the micro LED chips attached on the temporary fixing film 122 may be manufactured in a board type by a molding process, and may be fixed by a molding portion.

Figure 1D:
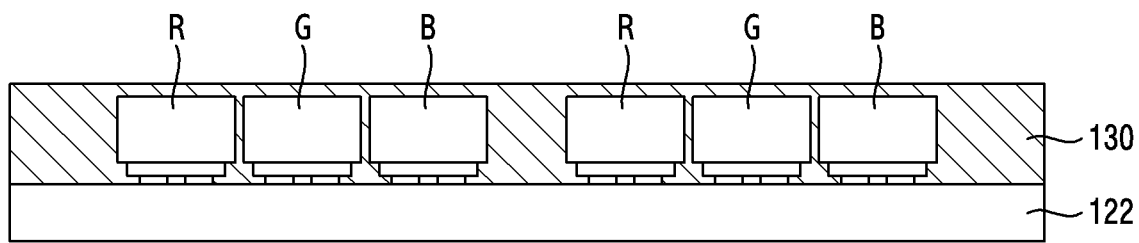

Referring to FIG. 1D, the re-arranged micro LED chips R/G/B according to various embodiments may be manufactured in a board type by a molding process, and may be fixed by a molding portion 130. For example, a board-type molding method may use transfer molding, injection molding, compression molding, or the like. A molding material may use epoxy-based or Si-based resin or the like. As will be described later, since a plurality of aligned micro LED chips R/G/B are molded in a board type by a molding process, electrical or physical coupling with a PCB (e.g., the PCB 160 of FIG. 1J) may be easily achieved.

Each of the molded micro LED chips R/G/B may maintain a state of being fixed on the temporary fixing film 122, and may be disposed in a board type. The re-arranged micro LEDs R/G/B may be prepared in a rigid board type by the molding portion 130. For example, each of the micro LED chips R/G/B may be fixed while maintaining a specific interval by the molding portion 130, and may resist a distortion or the like among the micro LED chips R/G/B.

Figure 1E:
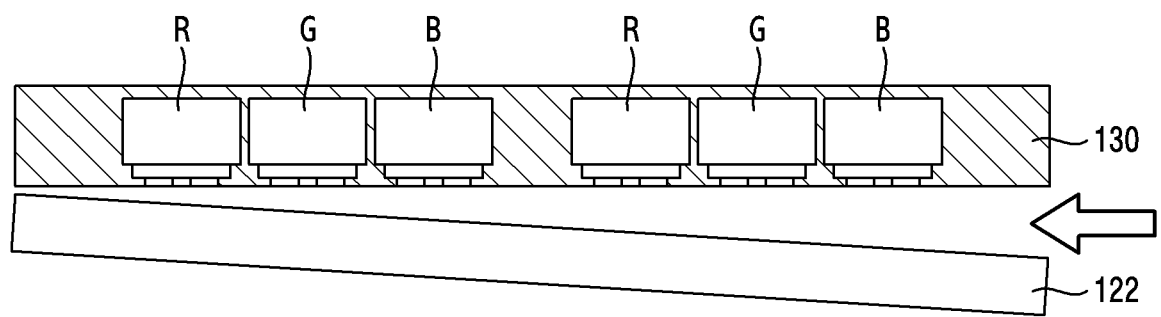

Referring to FIG. 1E, micro LED chips R/G/B according to various embodiments may be peeled off from the temporary fixing film 122 through an LLO process. The LLO process may irradiate a laser to separate the micro LED chips (the molding portion 130) and the temporary fixing film 122. A connecting pad may be exposed in each of the separated micro LED chips R/G/B.

Figure 1F:
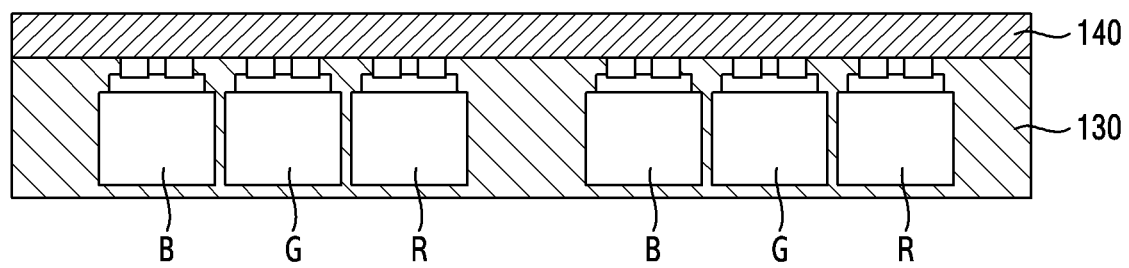

Referring to FIG. 1F, peeled-off micro LED chips R/G/B according to various embodiments may be disposed on a PCB 140. For example, a face of the PCB 140 may be bonded to a face of the molding portion 130. The face of the molding portion 130 may be a face on which a connecting pad of each of the micro LED chips R/G/B is exposed.

Figure 1G:
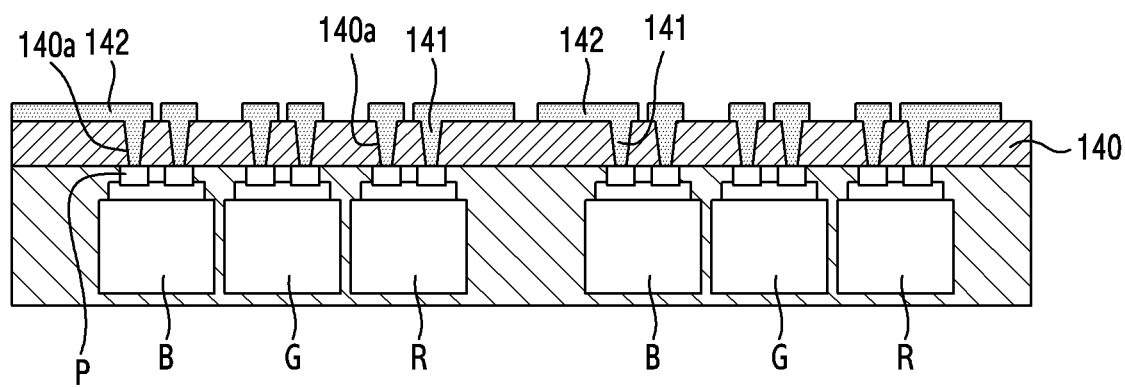

Referring to FIG. 1G, the PCB 140 according to various embodiments have a circuit 142 (an electrical coupling path) formed by performing an FOPLP process. That is, the circuit (interconnect) 142 formed on the PCB 140 may be electrically coupled to a pad p of each of the micro LED chips R/G/B by means of a conductive material 141 formed by a via 140*a*.

The FOPLP process may include a step of forming the via 140*a* at a lower face by using a laser, a step of filling the via 140*a* with the conductive material 141 (e.g., metal such as copper) by using a plating process, and a step of performing plating deposition on the lower face of the PCB 140 and then forming the circuit 142 through a photolithography process. The PCB 140 subjected to such a process may be referred to as a redistributing PCB. For example, any one of a $CO_2$ laser and an IR laser may be used as a layer for forming the via 140*a*. For example, in the plating process, any one of Cu, Sn, Sn—Ag alloy, and Sn—Ag—Cu alloy may be included as the conductive material 141 for filling the via 140*a*.

Figure 1H:
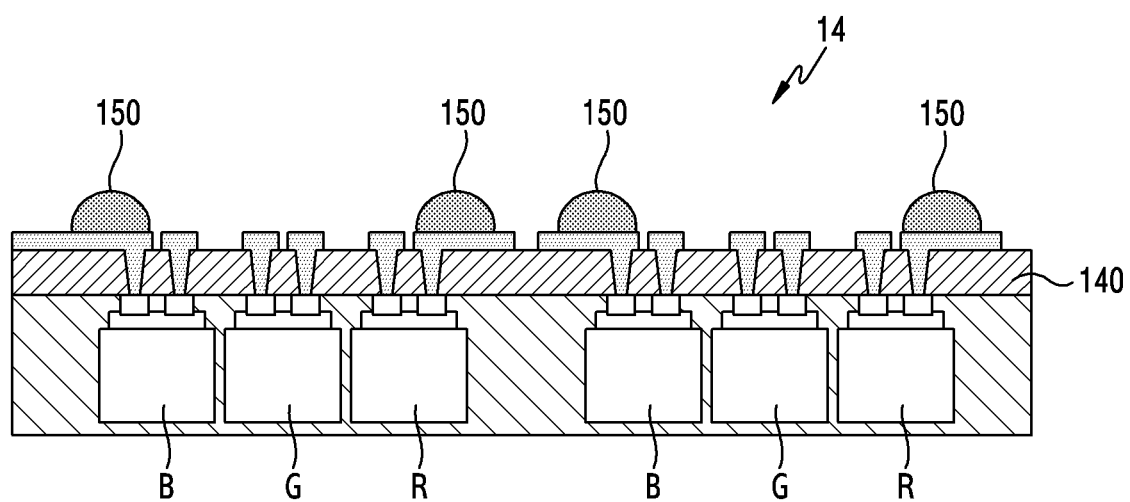

Referring to FIG. 1H, the PCB 140 subjected to the FOPLP process according to various embodiments may further have a conductive structure formed on a lower face, e.g., a face on which a circuit is formed. The conductive structure may be formed so that the micro LED chips R/G/B are electrically coupled to a main PCB (not shown).

The conductive structure according to various embodiments may include at least one solder electrode 150 (e.g., a solder ball) formed through a soldering process. For example, the solder electrode 150 may be formed to be electrically coupled with a connecting pad of the main PCB to be described below. The micro LED chips R/G/B according to various embodiments may be singulated with a specific-sized to produce it as a part. The micro LED chips manufactured in this manner may be referred to as a micro LED array package 14. The prepared micro LED array package 14 is shown in FIG. 1H.

The micro LED array package 14 according to various embodiments may be molded in a state where each of the micro LED chips R/G/B is aligned with a specific interval so that coupling with a PCB (e.g., the PCB 160 of FIG. 1I) is achieved easily. In addition, since molded micro LED chips R/G/B may be disposed in a board type, the coupling with the PCB may be achieved easily.

The micro LED array package 14 according to various embodiments may have an insulating or non-insulating construction between the micro LED chips R/G/B to prevent a distortion of a gap between the micro LED chips R/G/B. This construction may be molded in an integrated manner similarly to the micro LED chips R/G/B in the molding process.

The construction according to various embodiments may use a photosensitive polymer material using a photoresist or the like, and may use metal or the like formed by etching, plating, or the like.

The micro LED array package 14 according to various embodiments may be configured to extend a size of a bonding pad in comparison with the conventional size by using insulation and redistribution processes so that coupling with a PCB (e.g., the PCB 160 of FIG. 1I) is achieved easily.

The micro LED array package 14 according to various embodiments may decrease the number of bonding pads to be bonded by using a common electrode of the micro LED chips R/G/B so that coupling with a PCB (e.g., the PCB 160 of FIG. 1I) is achieved easily. For example, for the easiness of connection, the bonding pad may be configured with an additional connection member such as a solder bump, a Cu post, or the like.

Figure 1I:
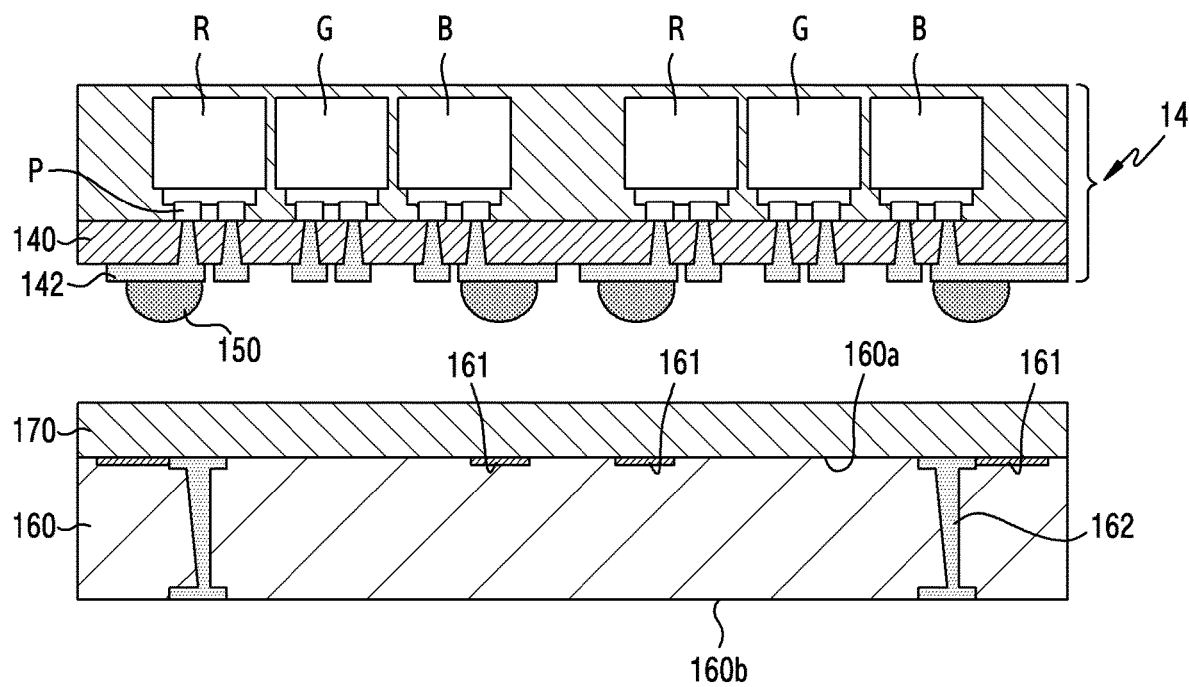
Figure 1J:
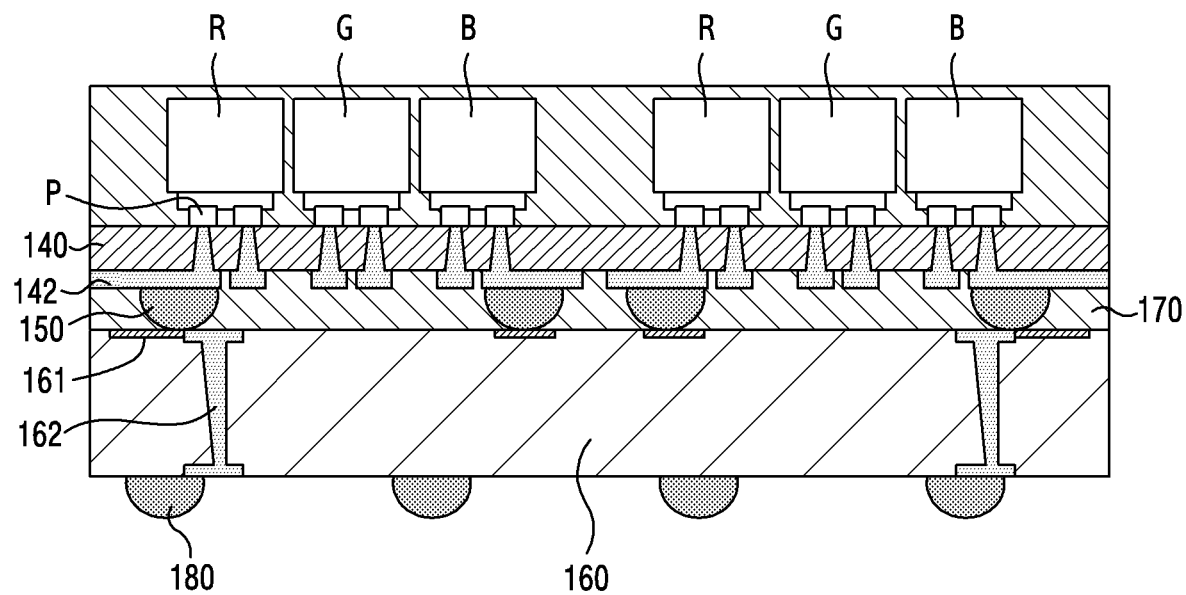

Referring to FIG. 1I and FIG. 1J, the prepared micro LED array package 14 according to various embodiments may be laminated on a PCB 160 through a heat treatment process by using a member 170. For example, the micro LED array package 14 may be electrically coupled with the PCB 160 in a physically integrated manner through the heat treatment process.

The PCB 160 according to various embodiments may be a substrate having a TFT structure. For example, the PCB 160 may be manufactured through a process of producing a transistor capable of controlling each pixel. The PCB 160 having the TFT structure may be an active element capable of maintaining desired voltage until a next-switch-on time in such a manner that a pixel is completely isolated at a switch-off time after the desired voltage is supplied to the pixel at a switch-on time. For example, the PCB 160 having the TFT structure may utilize a substrate material such as ceramic, glass, silicon, or the like capable of easily forming a high-temperature TFT. In addition, a plurality of vias 160*a* may be formed on the PCB 160, and the formed via 160*a* may be filled with a conductive paste such as cupper paste, silver paste, or the like to withstand the high-temperature TFT process.

In the PCB 160 having the TFT structure according to various embodiments, the PCB 160 to be utilized may be implemented with an additional polyimide film for withstanding the high-temperature TFT process, a relatively low-temperature via formed by laminating the polyimide film, and a rear interconnect.

In the PCB 160 configured by laminating the polyimide, in order to secure warpage and flatness of the PCB 160, as an example of a substrate material to be additionally laminated, not only a general material such as FR4, BT, or the like but also resin such as RCC or the like may be utilized for building up, and a structural substrate material such as glass, ceramic, SUS, or the like may be added.

The PCB 160 according to various embodiments may include one face 160a on which each connecting pad 161 is exposed and the other face 160b facing way from the face 160a. The other face 160b may be disposed such that the other end of a conductive material portion 162 electrically coupled with the connecting pad 161 is exposed. A second conductive structure 180 may be formed on the other end portion. For example, the second conductive structure 180 may include at least one solder electrode (e.g., a solder ball) formed through a soldering process. For example, the PCB 160 may be packaged by forming the second conductive structure 180. The second conductive structure 180 may be configured in a different shape from the first conductive structure 150.

The member 170 according to various embodiments may be formed to sufficiently fill between the PCB 160 and the micro LED array package 140 by heat treatment, as a member for coupling the micro LED array packet 14 and the PCB 160. The member 170 before the heat treatment is shown in FIG. 1I, and the member 170 after the heat treatment is shown in FIG. 1J.

In addition, the member 170 after the heat treatment may support a coupling state between the micro LED array package 14 and the PCB 160. For example, the member 170 may fill between first conductive structures 150 which exist between the micro LED array package 14 and the PCB 160.

The member 170 according to various embodiments may be attached to one face of the PCB 160 through coating or laminating before the heat treatment. The member 170 may be formed to entirely fill between the PCB 160 and the micro LED array package 14 by being dissolved after the heat treatment. For example, the member 170 may have a film shape constructed of synthetic resin or may be constructed of a metal sheet such as copper or the like, and may be subjected to heat treatment on an exposed connecting pad of the PCB 160 in a state of being attached to one face 160a of the PCB.

The heat treatment process according to various embodiments is a thermal compression bonding process. The micro LED array package 14 may be attached to the PCB 160 in an integrated manner by using the heat treatment process. In addition, the heat treatment process may include an ultrasonic welding process and a thermal melting process, and may use the thermal compression bonding process so that the micro LED array package 14 is mounted on the PCB 160 in an integrated manner.

A pad P of each of the micro LED chips R/G/B according to various embodiments may be electrically coupled to the solder pad 161 of the PCB 160 due to the first conductive structure 150, and the solder pad 161 may be electrically coupled to the second conductive structure 180 through the conductive material portion 162.

In a last step, the micro LED array package 14 produced as a part may be manufactured as a display on the PCB 160, and may be manufactured as a various-sized display.

Figure 2:
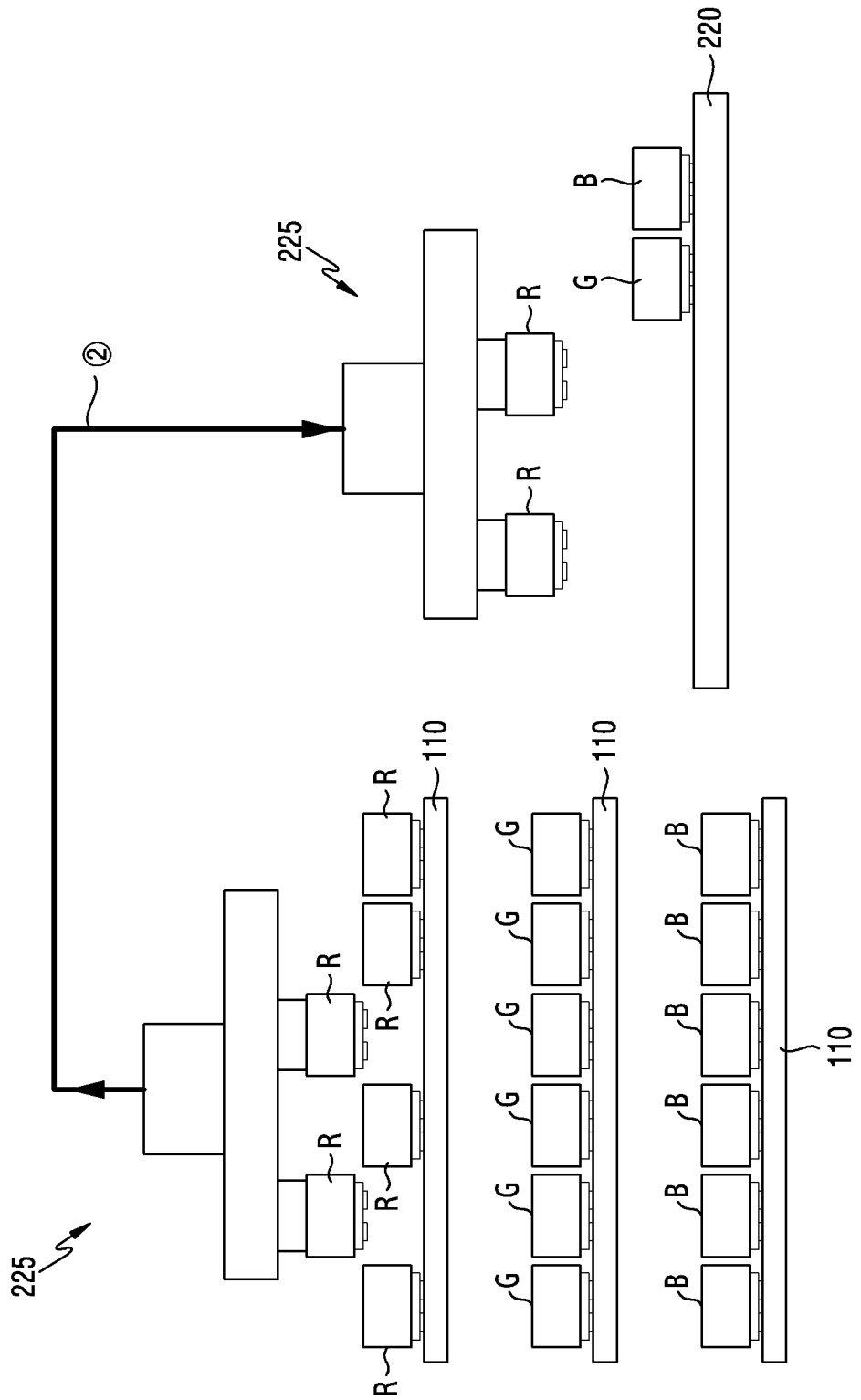
FIG. 2 is an exemplary diagram briefly illustrating a process of re-arranging a micro LED according to various embodiments of the disclosure.

FIG. 2 is an exemplary diagram briefly illustrating a process of re-arranging a micro LED according to various embodiments of the disclosure.

Referring to FIG. 2, a plurality of micro LEDs R/G/B attached in an aligned manner may be re-arranged on a substrate 220 in accordance with elements (e.g., pitch, color (R/G/B), gap, etc.) constituting a display pixel. Although a structure in which the plurality of micro LEDs R/G/B are re-arranged on the temporary fixing film 122 is shown in FIG. 1C, a process of re-arranging the plurality of micro LEDs R/G/B directly on the substrate 220 will be described in FIG. 2.

A process of re-arranging the micro LEDs R/G/B on the substrate 220 by using a pickup device 225 is shown in FIG. 2. After aligned micro LEDs B emitting blue, aligned micro LEDs G emitting green, and micro LEDs R emitting red are prepared, the micro LED R/G/B selected by the pickup device 225 may be moved to be re-aligned on the substrate 220. An arrow direction θ indicates a movement direction of the pickup device 225. The moved micro LED chips R/G/B may be disposed on a substrate in a state where RGB are re-arranged as one set.

Figure 3A:
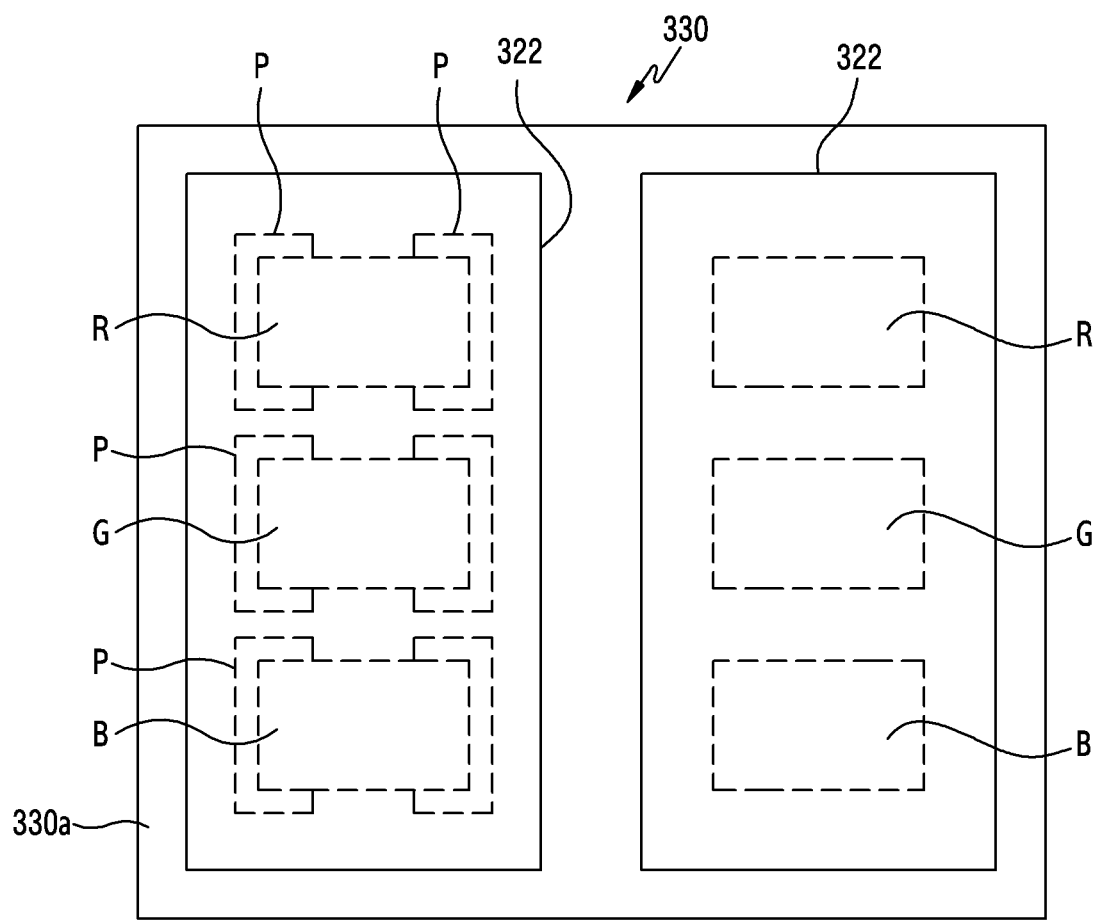
FIG. 3A is a cross-sectional view illustrating a state of performing a PR process on micro LED chips R/G/B according to various embodiments of the disclosure.
Figure 3B:
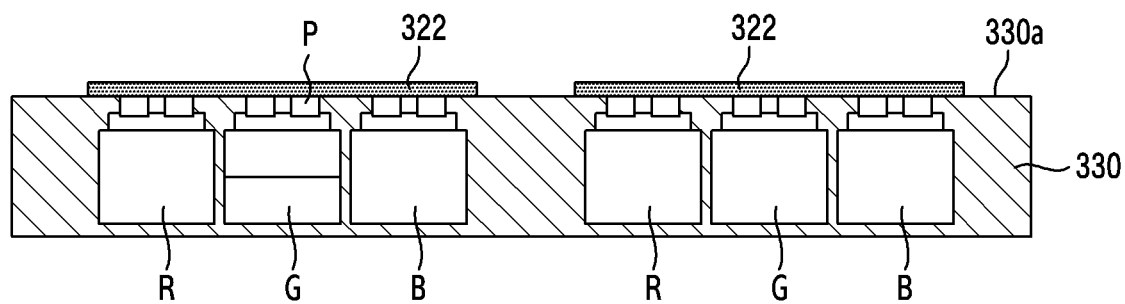
FIG. 3B is a plan view illustrating a state of applying a photosensitive material to micro LEDs R/G/B according to various embodiments of the disclosure.

FIG. 3A is a cross-sectional view illustrating a state of performing a PR process on micro LED chips R/G/B according to various embodiments of the disclosure. FIG. 3B is a plan view illustrating a state of applying a photosensitive material to micro LEDs R/G/B according to various embodiments of the disclosure.

Referring to FIG. 3A and FIG. 3B, micro LED chips R/G/B in a molding state of being peeled off from a temporary fixing film according to various embodiments may be subjected to a Proto Resist (PR) process before being connected to a PCB.

After being separated from the temporary fixing film, the micro LED chips R/G/B supported by a molding portion 330 may be subjected to PR or Solder Resist (SR) processes, that is, a photosensitive material may be coated on at least part of an upper face 330a. The coated photosensitive material may be coated on a specific region of the upper face 330a in a layer shape to fix a location for disposing the PCB 140, and may cover an interconnect state of each of the micro LED chips R/G/B. For example, the PR process may not be performed. Hereinafter, the coated photosensitive material will be referred to as a photosensitive layer.

Each photosensitive layer 322 according to various embodiments may be formed as a region that can sufficiently include a connecting pad P of each of the micro LED chips R/G/B. The connecting pad P of each of the micro LED chips R/G/B may be covered by the photosensitive layer 322.

FIG. 4A to FIG. 4K are cross-sectional views sequentially illustrating a method of manufacturing a micro LED display according to various embodiments of the disclosure. Referring to FIG. 4A to FIG. 4K, a method of manufacturing a display by using a technique of mounting a micro LED will be described according to various embodiments of the disclosure.

Figure 4A:
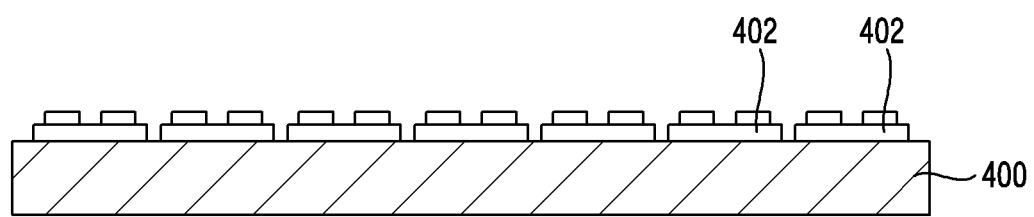
FIGS. 4A, 4B, 4C, 4D, 4E, 4F, 4G, 4H, 4I, 4J, and 4K are a cross-sectional views illustrating a method of manufacturing a micro LED display according to various embodiments of the disclosure, respectively.

Referring to FIG. 4A, a micro LED 402 is produced by being grown on a sapphire substrate 400, in a single-crystal state at high temperature/high pressure. Since this has already been described in detail in FIG. 1A, detailed descriptions thereof will be omitted to avoid redundancy.

Figure 4B:
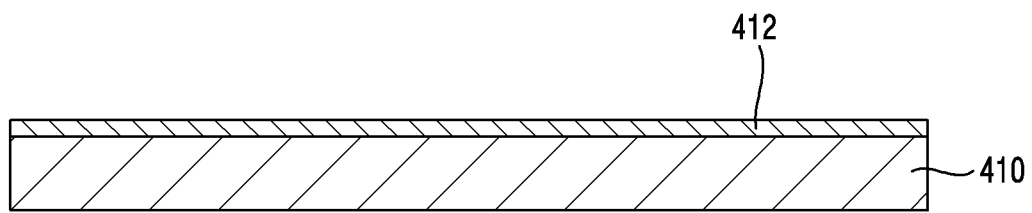

Referring to FIG. 4B, an uncured liquid material 412 may be coated on one face of a prepared substrate 410 according to various embodiments. For example, the uncured liquid material 412 according to various embodiments may be formed in a layer shape to have a specific thickness on one face of the substrate. Hereinafter, the coated uncured material will be referred to as an uncured layer.

The substrate 410 according to various embodiments may be constructed of a glass material. The layer-shaped substrate 410 may be disposed to overlap with the uncured layer 412.

Figure 4C:
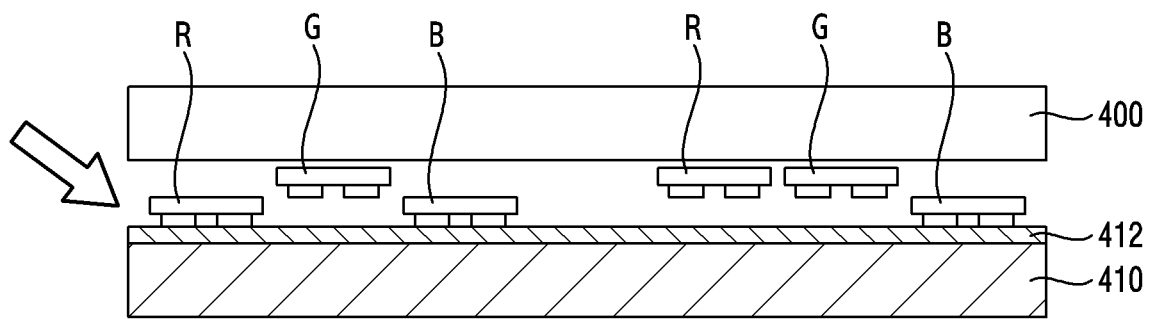

Referring to FIG. 4C, after curing the uncured layer 412 coated on the substrate 410, micro LEDs R/G/B may be peeled off on the sapphire substrate 400 through an LLO process, and the peeled-off micro LEDs R/G/B may be disposed to be re-arranged on the cured layer 412. A curing operation may irradiate an ultraviolet ray to cure the uncured layer 412 to a rigid layer.

Figure 4D:
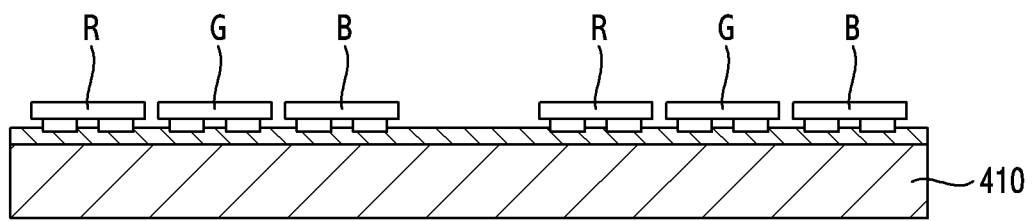

A micro LED re-arranged and fixed on the substrate 410 according to various embodiments is shown in FIG. 4D.

Figure 4E:
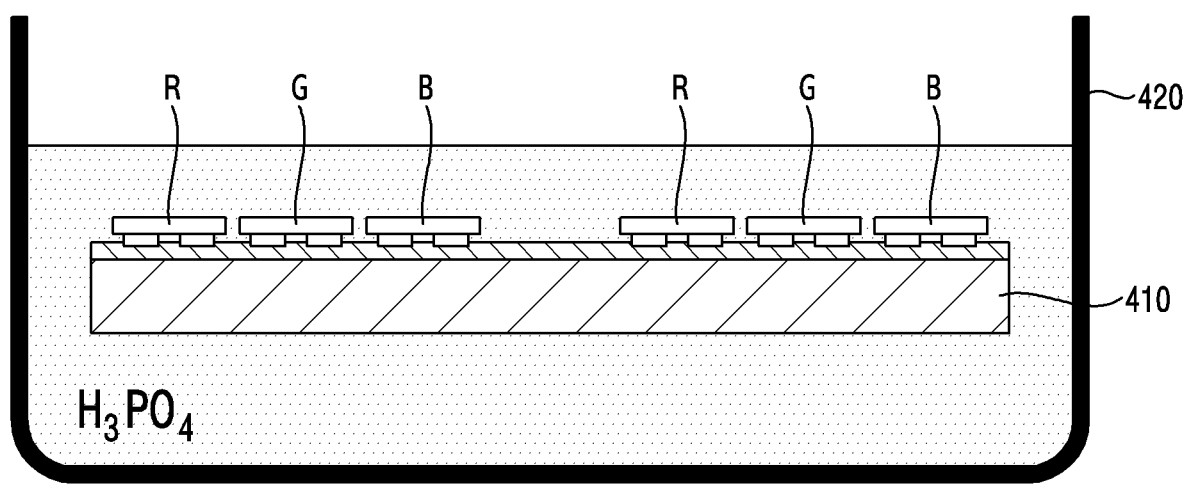

Referring to FIG. 4E, micro LEDs R/G/B re-arranged on the substrate 410 according to various embodiments may be subjected to wet etching to remove gallium (Ga). The gallium (Ga) is metal that exists in a liquid state at a room temperature, and remains partially on an LED layer separated during a Laser Lift Off (LLO) process. Since this causes LED brightness degradation, contamination, and a yield deterioration in a post-process (e.g., a molding process or the like), the gallium (Ga) may need to be removed. In a wet etching process, the gallium (Ga) may be removed by being dipped into phosphoric acid ($H_3PO_4$) or hydrochloric acid (HCL) aqueous solutions in a container 420 for a specific time. The wet etching process may not be performed in the disclosure.

Figure 4F:
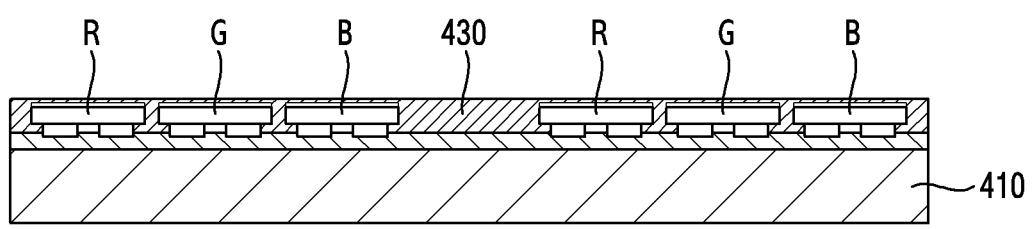

Referring to FIG. 4F, a method of molding re-arranged micro LEDs R/G/B according to various embodiments in a board type may use transfer molding, injection molding, or the like. For example, a molding material may use epoxy-based or Si-based resin or the like. The molded micro LEDs R/G/B may maintain a state of being fixed on the substrate 410, and may be disposed in a board type. The re-arranged micro LEDs R/G/B may maintain a rigid board type by a molding portion 430. For example, the molding portion 430 may be black.

Figure 4G:
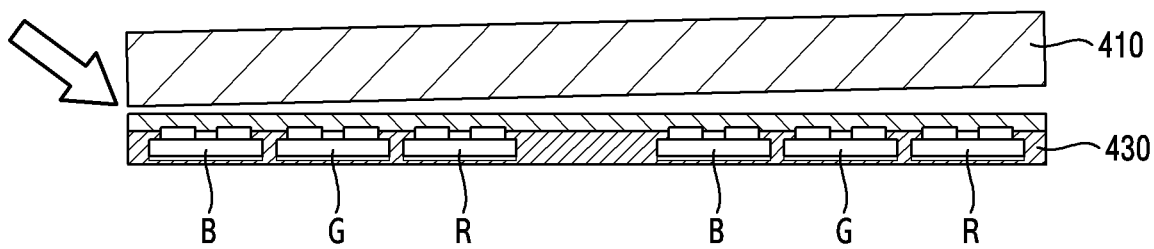

Referring to FIG. 4G, micro LEDs R/G/B according to various embodiments may be peeled off from the substrate 410 through an LLO process. The LLO process may irradiate a laser to separate the molding portion 430 and the substrate 410.

Figure 4H:
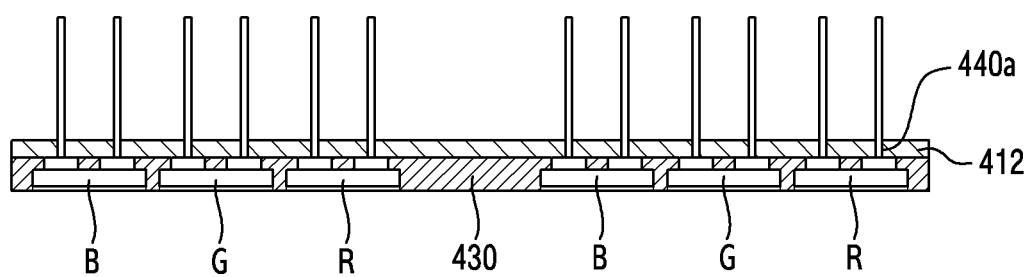
Figure 4I:
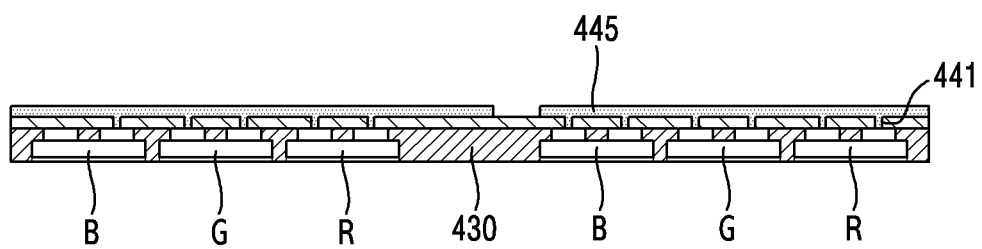

Referring to FIG. 4H and FIG. 4I, a via 440a may be configured in accordance with a pad location of micro LEDs R/G/B, and the via 440a may be filled with a conductive material 441 to implement a circuit 445.

The FOPLP process may include forming the via 440a in a lower portion of the molding portion 430 by using a layer, filling the via 4401 with the conductive material 441 (e.g., metal such as copper) by using a plating process, and forming the circuit 445 through a photolithography process after plating deposition is performed on a lower face of the layer 412.

Any one of a $CO_2$ laser and an IR laser may be used as a layer for forming the via 440a according to various embodiments. For example, any one of Cu, Sn, Sn—Ag alloy, and Sn—Ag—Cu alloy may be included as the conductive material 441 for filling the via 140a through coating.

Figure 4J:
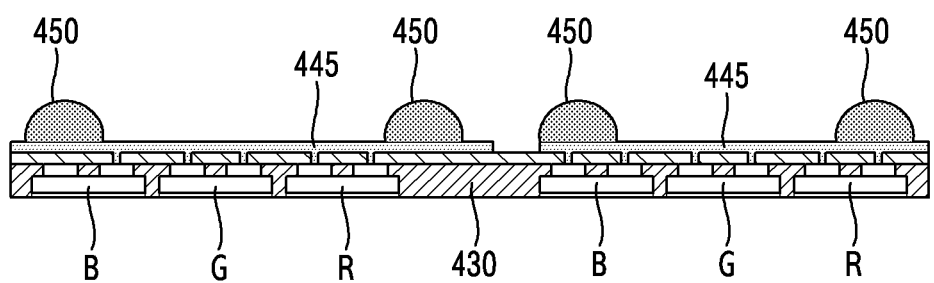

Referring to FIG. 4J, the layer 412 subjected to an FOPLP process according to various embodiments may have at least one solder electrode 450 (e.g., a solder ball) formed on a lower face through a soldering process. For example, the solder electrode 450 may be formed so that the conductive material layer 445 is electrically coupled to a solder pad of a main PCB described below. The micro LEDs R/G/B according to various embodiments may be singulated with a specific size to produce them as a part. The micro LEDs R/G/B manufactured in this manner may be referred to as a micro LED package.

Figure 4K:
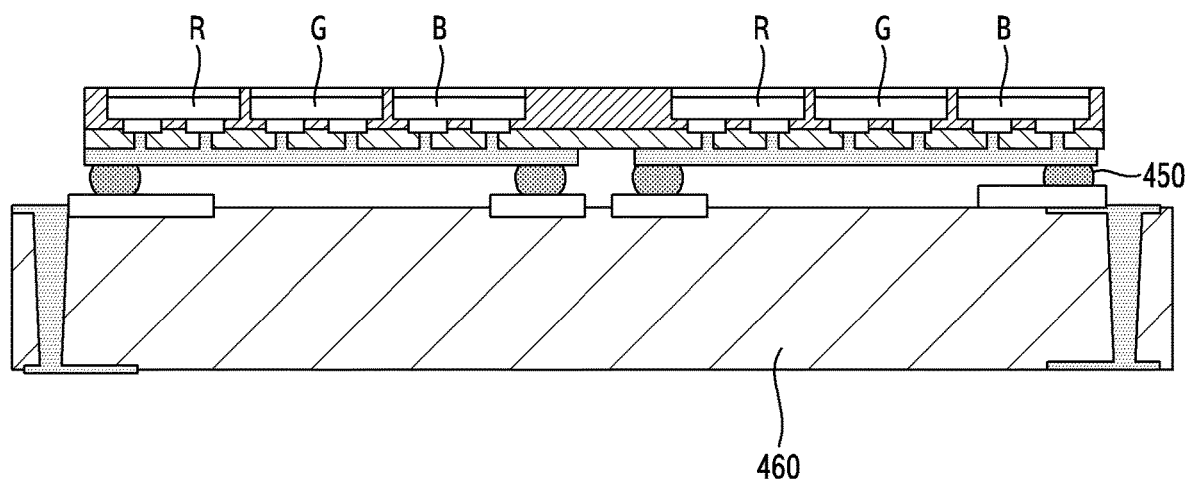

Referring to FIG. 4K, in the micro LED package according to various embodiments, the solder electrode 450 may be bonded to a pad 460a of a main PCB 460. The micro LED pad may be electrically coupled to the solder pad 460a of the main PCB due to the solder electrode 450. The micro LEDs R/G/B configured in such a structure may be at least part of a display.

In a last step, the micro LED package (module) produced as a part may be manufactured as a display by being mounted on a main board, and may be manufactured as a various-sized display.

Figure 5:
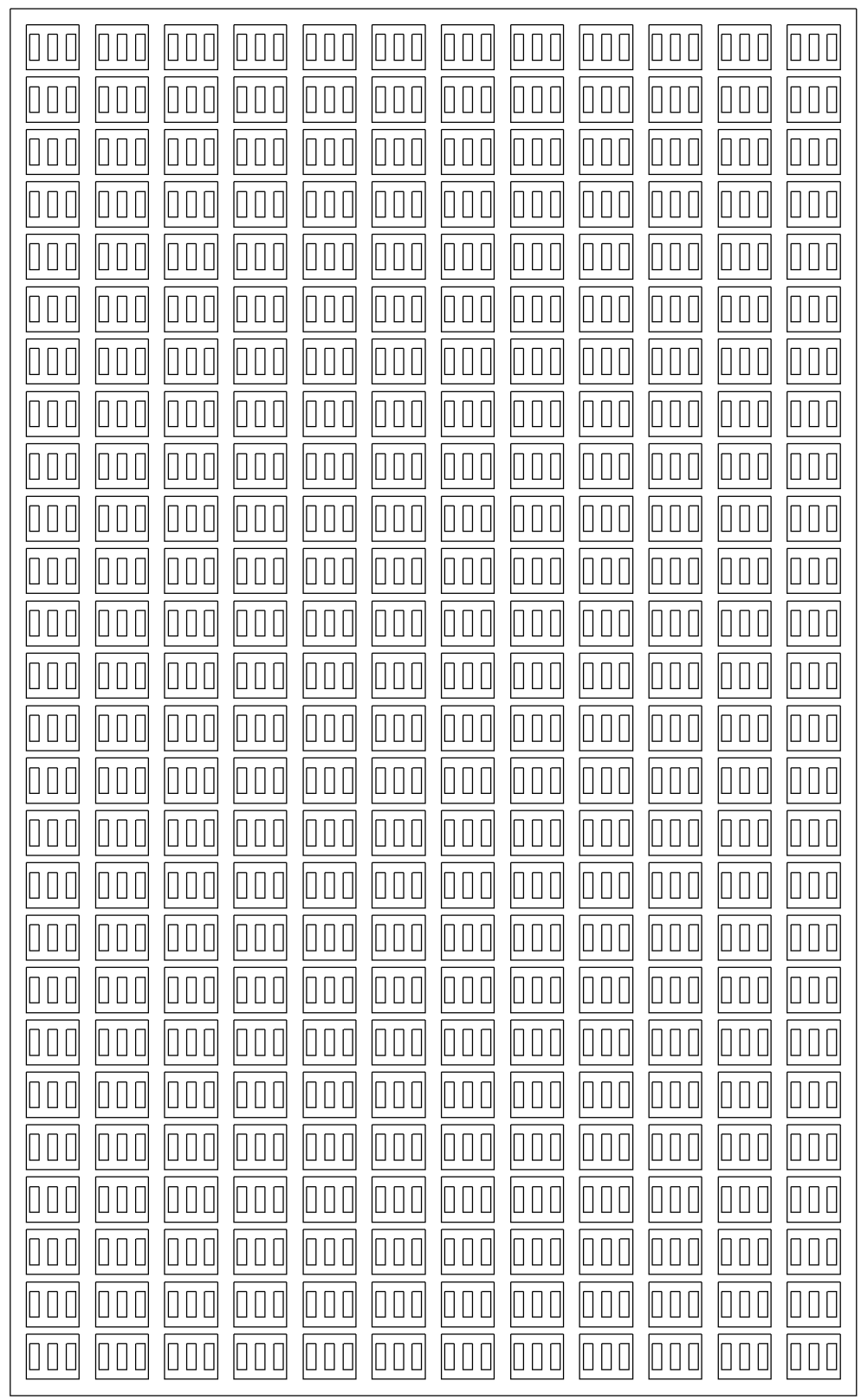
FIG. 5 is a plan view illustrating a display produced by using a display manufacturing method according to various embodiments of the disclosure.

A micro LED display 500 manufactured through the manufacturing process of FIG. 1A to FIG. 1J is shown in FIG. 5.

Figure 6:
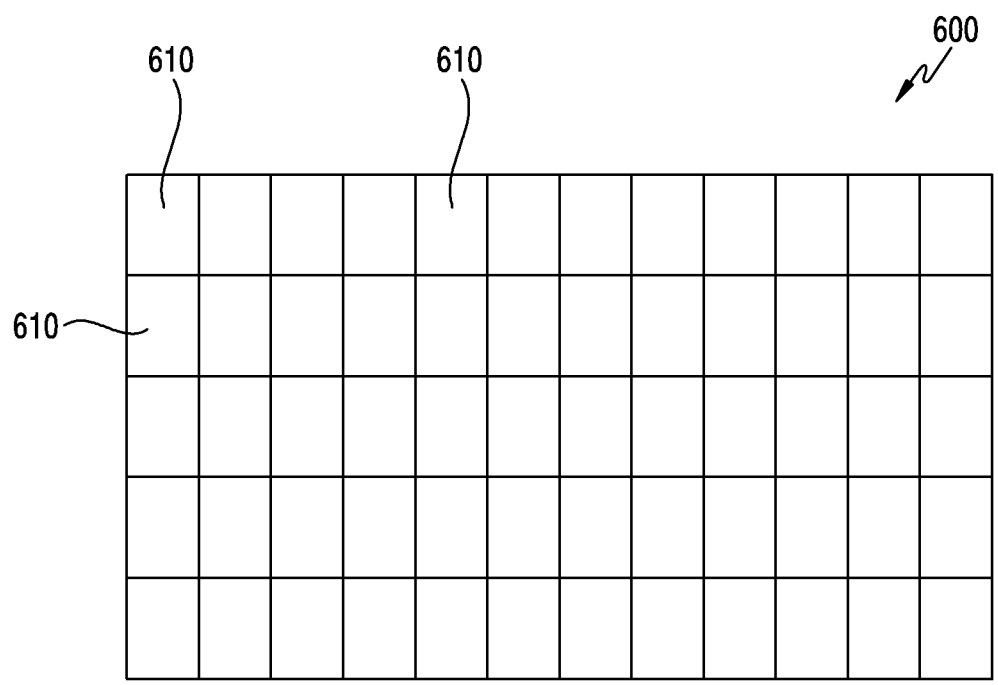
FIG. 6 is a plan view illustrating a display having a large screen size and combined with a micro LED display manufactured by using a display manufacturing method according to various embodiments of the disclosure.

FIG. 6 is a plan view illustrating a display having a large screen size and combined with a micro LED display 610 manufactured by using a display manufacturing method according to various embodiments of the disclosure.

Referring to FIG. 6, a plurality of manufactured micro LED displays 610 are assembled to manufacture an LED display 600 (e.g., a large-sized TV or a theatrical display or the like) of more various wide bandwidths.

Figure 7:
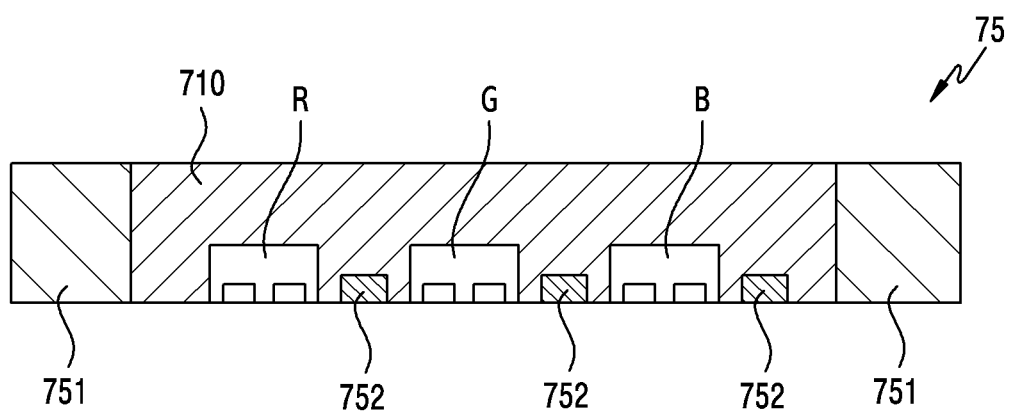
FIG. 7 is a cross-sectional view illustrating an insulating construction and non-insulating construction formed on a micro LED chip package according to various embodiments of the disclosure.

Referring to FIG. 7, a micro LED array package 75 may have an insulating or non-insulating construction 751 between micro LED chips R/G/B to prevent a distortion between the micro LED chips R/G/B when each of the micro LED chips R/G/B is molded after being aligned with a specific interval for easiness of coupling with a 752 PCB. For example, an insulating construction 752 may be disposed between the micro LED chips R/G/B, and may be disposed between micro LED chips constructed of one RGB set. In addition, a non-insulating construction 751 may be disposed between the micro LED chips R/G/B, and may be disposed between micro LED chips constructed of one RGB set. For example, the non-insulating construction 751 may include a partition of a conductive material.

Figure 8:
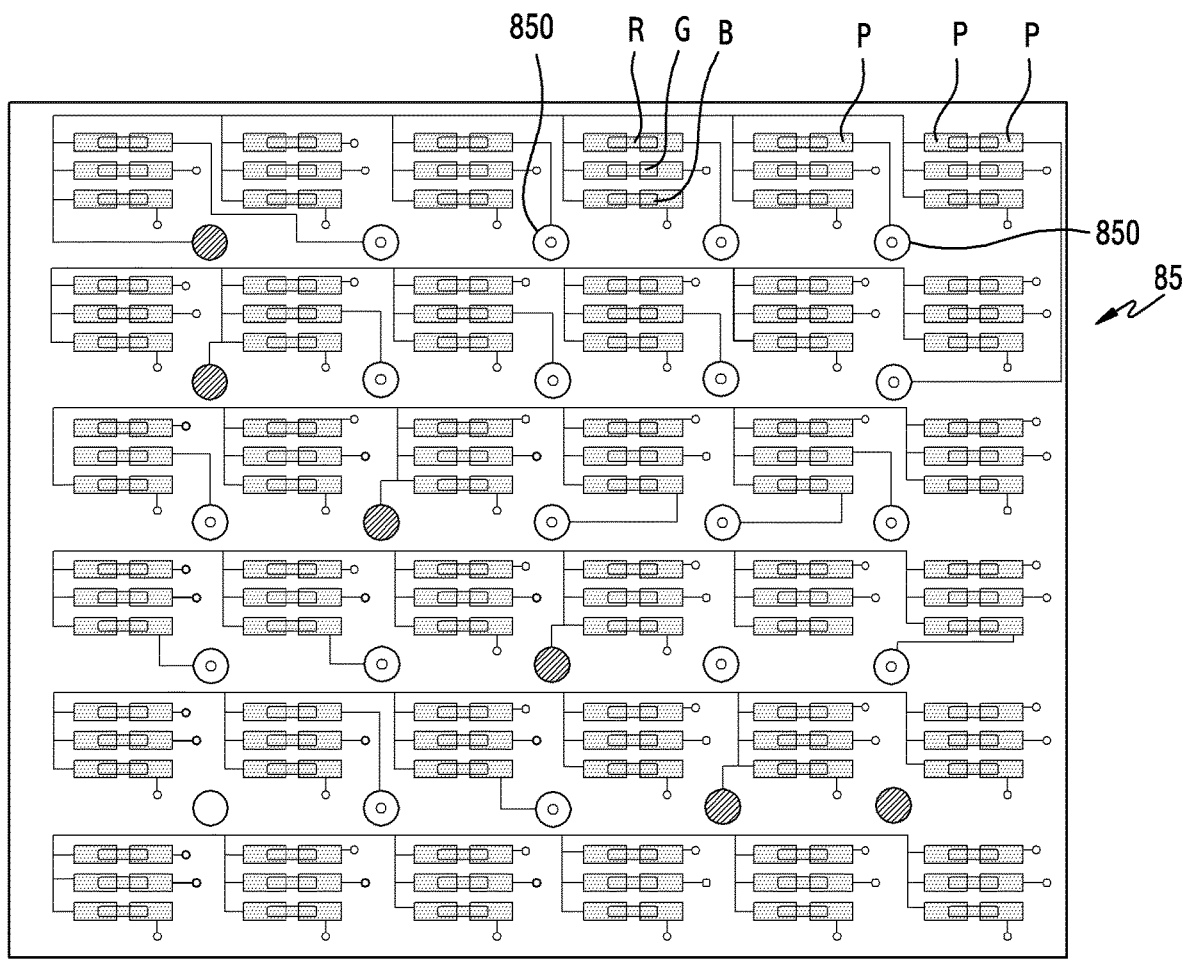
FIG. 8 illustrates a state in which a common electrode is provided in a micro LED chip package according to various embodiments of the disclosure.

Referring to FIG. 8, a micro LED array package 85 may be configured to extend a size of a connecting pad P by using insulation and redistribution processes so that coupling with a PCB is achieved easily, and to decrease the number of the connecting pads P by coupling and bonding a common electrode 850 between the micro LED chips R/G/B.

A term "module" used in the disclosure may imply a unit including, for example, one of hardware, software, and firmware or a combination of two or more of them. The "module" may be interchangeably used with a term such as a unit, a logic, a logical block, a component, a circuit, or the like. The "module" may be a minimum unit of an integrally constituted component or may be a part thereof. The "module" may be a minimum unit for performing one or more functions or may be a part thereof. The "module" may be mechanically or electrically implemented. For example, the "module" of the present disclosure may include at least one of an Application-Specific Integrated Circuit (ASIC) chip, a Field-Programmable Gate Arrays (FPGAs), and a programmable-logic device, which are known or will be developed and which perform certain operations.

At least some parts of a device (e.g., modules or functions thereof) or method (e.g., operations) based on the disclosure according to various embodiments may be implemented with an instruction stored in a computer-readable storage media. If the instruction is executed by one or more processors (e.g., the processor 210), the one or more processors may perform a function corresponding to the instruction.

The computer-readable storage media may be, for example, the memory 220. At least part of the program module may be implemented (e.g., executed), for example, by a processor. At least part of the programming module may include modules, programs, routines, sets of instructions, processes, or the like for performing one or more functions.

The computer readable recording medium may include a hard disk, a floppy disk, magnetic media (e.g., a magnetic tape), optical media (e.g., a Compact Disc-ROM (CD-ROM), a Digital Versatile Disc (DVD), magnetic-optic media (e.g., a floptical disk)), a hardware device (e.g., a Read Only Memory (ROM), a Random Access Memory (RAM), a flash memory, or the like), or the like. An example of the program instruction includes not only a machine language created by a compiler but also a high-level language executable by a computer by using an interpreter or the like. The aforementioned hardware device may be configured to operate as one or more software modules to perform the operation of the disclosure, and the other way around is also possible.

The module or programming module according to the disclosure may further include at least one or more components among the aforementioned components, or may omit some of them, or may further include additional other components. Operations performed by a module, programming module, or other components according to the disclosure may be executed in a sequential, parallel, repetitive, or heuristic manner. Further, some of the operations may be executed in a different order or may be omitted, or other operations may be added.

Various embodiments of the disclosure disclosed in the specification and the drawing are merely a specific example presented for clarity and are not intended to limit the scope of the disclosure. Therefore, in addition to the embodiments disclosed herein, various changes in forms and details made without departing from the technical concept of the disclosure will be construed as being included in the scope of the disclosure.

What is claimed is:

1. A method comprising:
    attaching micro LED chips having a first arrangement to a carrier film;
    re-arranging the micro LED chips on a temporary fixing film in an Red Green Blue (RGB) second arrangement in accordance with a display pixel configuration, using a pickup device;
    fixing the re-arranged micro LED chips in a mold;
    coating a photosensitive material on connecting pads of the micro LED chips to fix locations for coupling the connecting pads to circuits on a printed circuit board (PCB); and
    bonding the PCB to a face of the mold.

2. A method of manufacturing a micro LED display, the method comprising:
    attaching each of micro LED chips to a carrier film in a pad down form;
    re-arranging the attached micro LED chips in accordance with a pixel configuration of the display in a pad down form to a temporary fixing film, using a pickup device;
    molding the re-arranged micro LED chips in a mold;
    removing the temporary fixing film from the molded micro LED chips; and
    performing Fan-Out Panel Level Package (FOPLP) processing on the molded micro LED chips.

3. The method of claim 2, further comprising:
    bonding the micro LED chips to a substrate, wherein the FOPLP processing is performed on the micro LED chips having the substrate bonded thereto, and
    wherein the FOPLP processing comprises:
        forming a via in a lower portion of the substrate using a laser;
        filling the via with a conductive material using a plating process; and
        forming a circuit through a photolithography process after plating deposition is performed on a face of the substrate.

4. The method of claim 3, further comprising:
    forming a solder electrode on a connecting pad of the micro LED chips;
    performing singulation on the micro LED chips, on which the solder electrode is formed, with a package of a specific size; and
    mounting the package of the micro LED chips to a PCB to produce a display.

5. The method of claim 2, further comprising separating the micro LED chips from a sapphire substrate using a Laser Lift-Off (LLO) process of irradiating a laser to the micro LED chips attached to the sapphire substrate, and wherein the temporary fixing film is removed through the LLO process.

6. The method of claim 5, further comprising a wet etching process in which the micro LED chips separated from the sapphire substrate are dipped into liquid metal ($H_3PO_4$) in a container for a specific time, wherein the wet etching process removes gallium.

* * * * *